United States Patent
Beam, III et al.

(10) Patent No.: US 9,029,914 B2
(45) Date of Patent: May 12, 2015

(54) GROUP III-NITRIDE-BASED TRANSISTOR WITH GATE DIELECTRIC INCLUDING A FLUORIDE -OR CHLORIDE- BASED COMPOUND

(71) Applicant: TriQuint Semiconductor, Inc., Hillsboro, OR (US)

(72) Inventors: Edward A. Beam, III, Plano, TX (US); Paul Saunier, Dallas, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 67 days.

(21) Appl. No.: 13/685,560

(22) Filed: Nov. 26, 2012

(65) Prior Publication Data

US 2014/0145243 A1    May 29, 2014

(51) Int. Cl.
| | |
|---|---|
| *H01L 31/062* | (2012.01) |
| *H01L 29/66* | (2006.01) |
| *H01L 29/778* | (2006.01) |
| *H01L 29/40* | (2006.01) |
| *H01L 29/423* | (2006.01) |
| *H01L 29/20* | (2006.01) |

(52) U.S. Cl.
CPC ......... *H01L 29/66431* (2013.01); *H01L 29/402* (2013.01); *H01L 29/4232* (2013.01); *H01L 29/66462* (2013.01); *H01L 29/7787* (2013.01); *H01L 29/2003* (2013.01)

(58) Field of Classification Search
CPC ............ H01L 29/778; H01L 29/66431; H01L 29/66462; H01L 29/7787; H01L 29/402; H01L 29/4232; H01L 29/2003
USPC .......... 257/183, 194, 200, E29.085, E29.246, 257/E29.248, E21.403, 12, 94, 85, E51.01, 257/E29.081, E29.103
See application file for complete search history.

(56) References Cited

U.S. PATENT DOCUMENTS

| | | | | |
|---|---|---|---|---|
| 5,310,696 | A  * | 5/1994  | McCann et al. | 117/58 |
| 7,838,904 | B2 * | 11/2010 | Nakazawa et al. | 257/194 |
| 2002/0101895 | A1 * | 8/2002  | Augusto | 372/44 |
| 2005/0037556 | A1 * | 2/2005  | Grutzmacher | 438/197 |
| 2005/0258422 | A1 * | 11/2005 | Koo et al. | 257/59 |
| 2007/0145347 | A1 * | 6/2007  | Katayama et al. | 257/9 |
| 2007/0235768 | A1 * | 10/2007 | Nakazawa et al. | 257/211 |
| 2008/0023703 | A1 * | 1/2008  | Hoffman et al. | 257/59 |
| 2009/0267078 | A1 * | 10/2009 | Mishra et al. | 257/76 |

(Continued)

OTHER PUBLICATIONS

Saunier, P., "High Electron Mobility Transistor Structure and Method," U.S. Appl. No. 13/941,413, filed Jul. 12, 2013.

(Continued)

*Primary Examiner* — Cuong Q Nguyen
*Assistant Examiner* — Yosef Gebreyesus
(74) *Attorney, Agent, or Firm* — Schwabe Williamson & Wyatt

(57) ABSTRACT

Embodiments of the present disclosure describe apparatuses, methods, and systems of an integrated circuit (IC) device. The IC device may include a buffer layer disposed on a substrate, the buffer layer including gallium (Ga) and nitrogen (N) and a barrier layer disposed on the buffer layer, the barrier layer including aluminum (Al) and nitrogen (N). The IC device may further include a gate terminal and a gate dielectric layer disposed between the gate terminal and the barrier layer and/or between the gate terminal and the buffer layer. In various embodiments, the gate dielectric layer may include a fluoride- or chloride-based compound, such as calcium fluoride ($CaF_2$).

11 Claims, 4 Drawing Sheets

(56) References Cited

U.S. PATENT DOCUMENTS

| | | | |
|---|---|---|---|
| 2010/0025730 A1* | 2/2010 | Heikman et al. | 257/194 |
| 2010/0072460 A1* | 3/2010 | Bjoerk et al. | 257/24 |
| 2010/0193839 A1* | 8/2010 | Takatani | 257/192 |
| 2011/0024797 A1* | 2/2011 | Nakazawa et al. | 257/194 |
| 2011/0121313 A1* | 5/2011 | Briere | 257/76 |
| 2013/0099284 A1 | 4/2013 | Tserng et al. | |

OTHER PUBLICATIONS

Suh, C. S., "Group III-Nitride Transistor With Charge-Inducing Layer," U.S. Appl. No. 13/481,198, filed May 25, 2012.

Saunier, P. et al., "Group III-Nitride Transistor Using a Regrown Structure," U.S. Appl. No. 13/535,127, filed Jun. 27, 2012.

Saunier, P. et al., "In-Situ Barrier Oxidation Techniques and Configurations," U.S. Appl. No. 13/484,215, filed May 30, 2012.

* cited by examiner

US 9,029,914 B2

GROUP III-NITRIDE-BASED TRANSISTOR WITH GATE DIELECTRIC INCLUDING A FLUORIDE -OR CHLORIDE- BASED COMPOUND

FIELD

Embodiments of the present disclosure generally relate to the field of integrated circuits, and more particularly, to transistors with a gate dielectric including a fluoride- or chloride-based compound.

BACKGROUND

Presently, group III-nitride-based transistors such as gallium nitride (GaN)-based high electron mobility transistors (HEMTs) are typically depletion-mode (D-mode) devices. D-mode devices are on (e.g., conduct current in the channel) at a zero voltage of the gate with respect to the source, and must be pulled down to a negative pinch-off voltage (also referred to as threshold voltage) to pinch off the current flow. In contrast, enhancement-mode (E-mode) devices, which are off at a zero gate voltage and use a positive gate voltage to turn on the E-mode device, may be desirable for applications such as power switching. However, conventional GaN HEMT structures with termination layers directly in contact with the Schottky metal stack exhibit significant gate leakage which can vary over time due to thermal or electrical stresses. These structures are unsuitable for E-mode devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure provide techniques and configurations of a group III-nitride transistor having a gate dielectric layer that includes a fluoride- or chloride-based compound. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed, disposed, or otherwise configured on a second layer," may mean that the first layer is formed, disposed, or otherwise configured over the second layer, and at least a part of the first layer may be in direct contact (e.g., direct physical and/or electrical contact) or indirect contact (e.g., having one or more other layers between the first layer and the second layer) with at least a part of the second layer.

Figure 1:
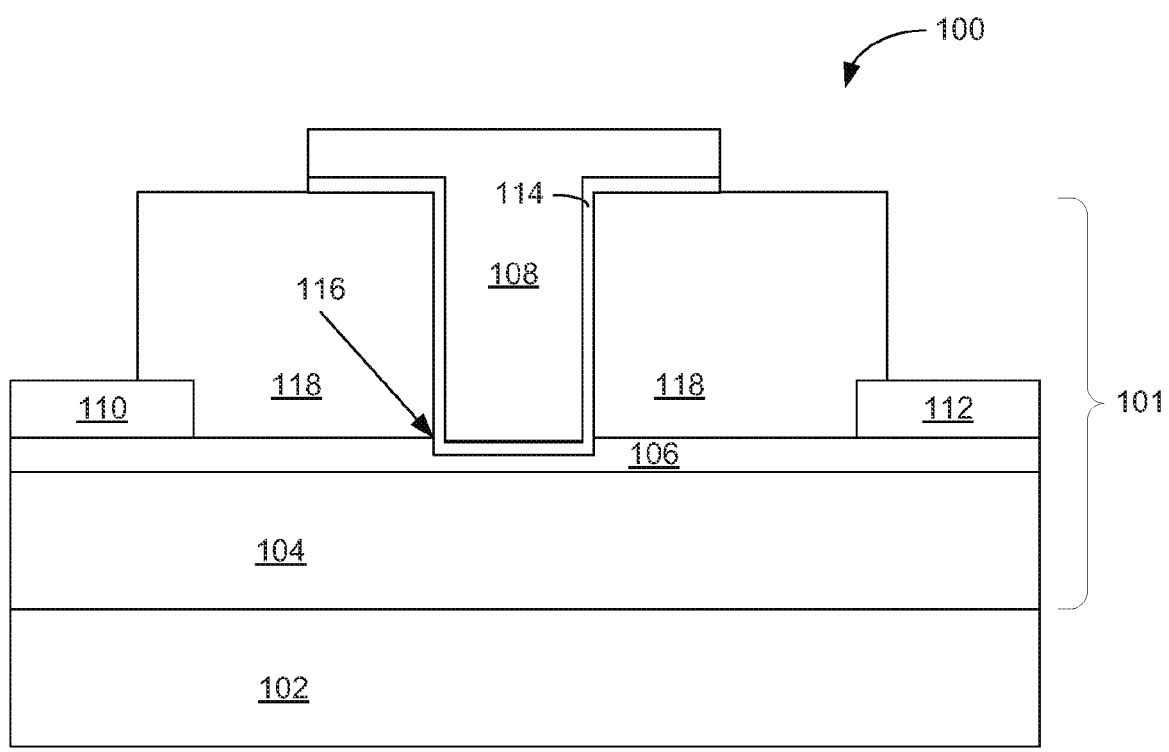
FIG. 1 schematically illustrates a cross-section view of an integrated circuit (IC) device, according to various embodiments.

FIG. 1 schematically illustrates a cross-sectional view of an integrated circuit (IC) device 100, according to various embodiments. The IC device 100 may be a transistor, such as a high electron mobility transistor (HEMT) device. The IC device 100 may be fabricated on a substrate 102. A stack of layers (collectively referred to as stack 101) may be deposited on the substrate 102. The stack 101 may include layers of different material systems that form one or more heterojunctions/heterostructures. For example, the stack 101 may include a buffer layer 104 disposed on the substrate 102, and a barrier layer 106 disposed on the buffer layer 104. In some embodiments, one or more of the layers of the stack 101 (e.g., the buffer layer 104 and/or barrier layer 106) may be epitaxially deposited.

Figure 2:
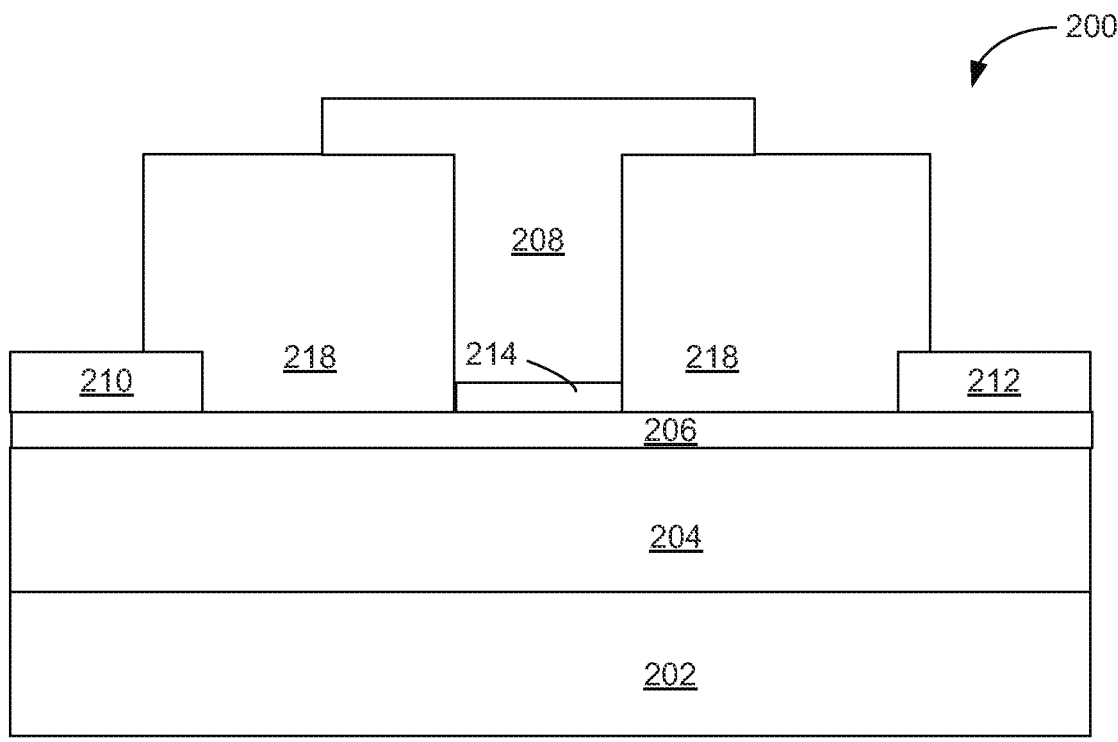
FIG. 2 schematically illustrates a cross-section view of another IC device, according to various embodiments.
Figure 3:
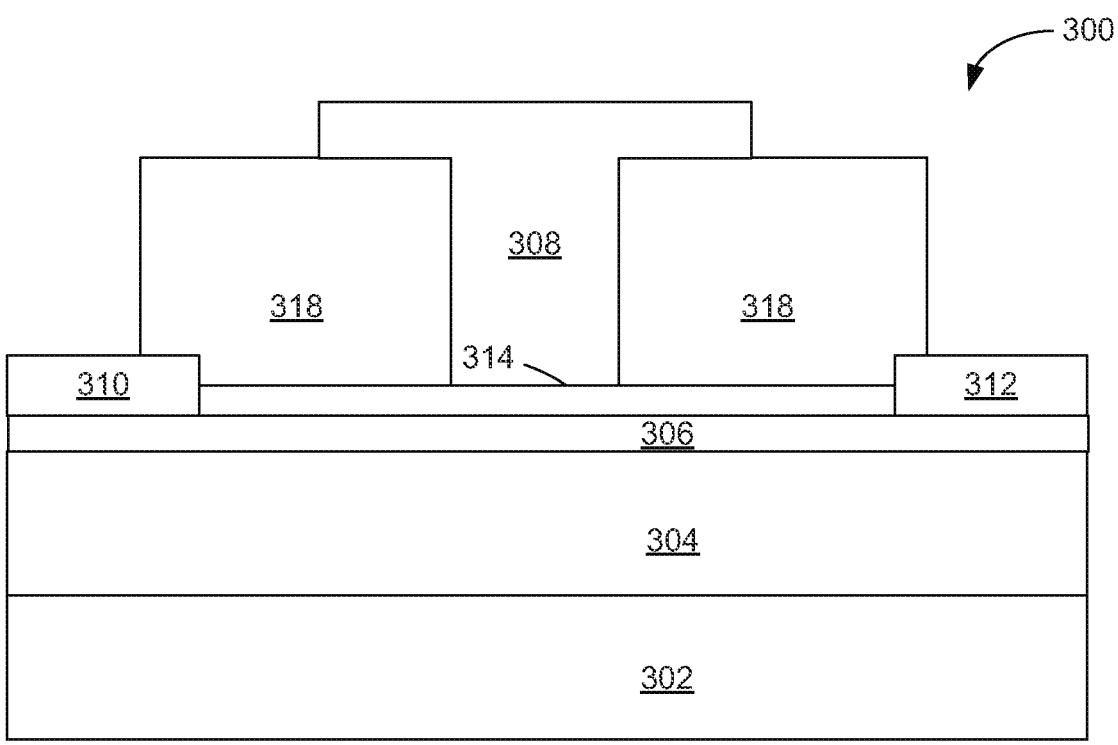
FIG. 3 schematically illustrates a cross-section view of yet another IC device, according to various embodiments.

The IC device 100 may further include a gate terminal 108, a source terminal 110, and a drain terminal 112. In various embodiments, the IC device 100 may further include a gate dielectric layer 114 disposed in or on the barrier layer 106. The gate dielectric layer 114 may be disposed between the gate terminal 108 and the barrier layer 106 or buffer layer 104. Accordingly, the gate dielectric layer 114 may provide a metal-insulator-semiconductor (MIS) junction. In various embodiments, the gate dielectric layer 114 may include fluorine (F) or chlorine (Cl) (e.g., a stable fluoride- or chloride-based compound). For example, in one embodiment, the gate dielectric layer 114 may include calcium fluoride ($CaF_2$). The fluoride- or chloride-based compound of the gate dielectric layer 114 may allow a higher gate voltage to be applied at the gate terminal 108 compared with conventional HEMT devices. The fluoride- or chloride-based compound may facilitate the IC device 100 to be an enhancement-mode (E-mode) device. In other embodiments, the fluoride- or chloride-based compound may be used in a depletion-mode (D-mode) device (e.g., as shown in FIG. 2 and FIG. 3, discussed below).

The substrate 102 generally includes a support material upon which the stack 101 is deposited. In an embodiment, the substrate 102 includes silicon (Si), silicon carbide (SiC), aluminum oxide ($Al_2O_3$) or "sapphire," gallium nitride (GaN), and/or aluminum nitride (AlN). Other materials including suitable group II-VI and group III-V semiconductor material systems can be used for the substrate 102 in other embodiments. In an embodiment, the substrate 102 may be composed of any material or combination of materials upon which material of the buffer layer 104 can be epitaxially grown.

In various embodiments, the buffer layer 104 may provide a crystal structure transition between the substrate 102 and other components (e.g., barrier layer 106) of the IC device 100, thereby acting as a buffer or isolation layer between the substrate 102 and other components of the IC device 100. For example, the buffer layer 104 may provide stress relaxation between the substrate 102 and other lattice-mismatched materials (e.g., the barrier layer 106). In some embodiments, the buffer layer 104 may serve as a channel for mobile charge carriers of the IC device 100. The buffer layer 104 may be undoped in some embodiments. The buffer layer 104 may be epitaxially coupled with the substrate 102. In other embodiments, a nucleation layer (not shown) may intervene between the substrate 102 and the buffer layer 104. In some embodiments, the buffer layer 104 may be composed of a plurality of deposited films or layers.

In some embodiments, the buffer layer 104 may include a group III-nitride-based material such as, for example, gallium nitride (GaN), aluminum nitride (AlN), or aluminum gallium nitride (AlGaN). The buffer layer 104 may have a thickness from 1 to 3 microns in a direction that is substantially perpendicular to a surface of the substrate 102 upon which the buffer layer 104 is formed. The buffer layer 104 may include other suitable materials and/or thicknesses in other embodiments.

In various embodiments, a heterojunction may be formed between the barrier layer 106 and the buffer layer 104. The barrier layer 106 may have a bandgap energy that is greater than a bandgap energy of the buffer layer 104. The barrier layer 106 may be a wider bandgap layer that supplies mobile charge carriers and the buffer layer 104 may be a narrower bandgap layer that provides a channel or pathway for the mobile charge carriers.

The barrier layer 106 may be composed of any of a variety of suitable material systems such as, for example, group III-nitride-based material systems. The barrier layer 106 may include, for example, aluminum (Al), indium (In), gallium (Ga), and/or nitrogen (N). In some embodiments, the barrier layer 106 may be composed of a single layer of a single material. For example, in one embodiment, the barrier layer 106 may be composed of a single layer of aluminum gallium nitride ($Al_xGa_{1-x}N$), where x is a value from 0 to 1 that represents relative quantities of aluminum and gallium. In other embodiments, the barrier layer 106 may be composed of a plurality of deposited films or layers. For example, the barrier layer 106 may include a layer of aluminum nitride (AlN) disposed on the buffer layer 104 and a layer of indium aluminum nitride (InAlN), aluminum gallium nitride (AlGaN), or indium gallium aluminum nitride (InGaAlN) disposed on the aluminum nitride layer.

As discussed above, the IC device 100 may be an E-mode device in some embodiments, which may have a positive threshold voltage. The E-mode IC device 100 may be normally off (e.g., may inhibit current between the source terminal 110 and the drain terminal 112) for a gate voltage (with respect to the source voltage) less than the threshold voltage. The E-mode IC device 100 may be turned on (e.g., may allow current flow between the source terminal 110 and the drain terminal 112) when the gate voltage is above the threshold voltage.

In various embodiments, the IC device 100 may include a recess 116 in the barrier layer 106 to facilitate the IC device 100 to be E-mode. The gate dielectric layer 114 may be disposed in the recess 116. In some embodiments, the recess 116 may extend to or into the buffer layer 104, and the gate dielectric 114 may be disposed on the buffer layer 104. In other embodiments, the recess 116 may not extend to the buffer layer 104.

The gate dielectric layer 114 may serve as an insulating layer of the gate terminal 108 to provide an E-mode device. The fluoride- or chloride-based compound of the gate dielectric layer 114 may facilitate the E-mode device. The fluoride- or chloride-based compound may provide low gate leakage between the gate terminal and the barrier layer 106 and/or buffer layer 104. The fluoride- or chloride-based compound may further provide consistent performance properties (e.g., trap density) of the MIS interface over process, voltage, temperature, and/or time parameters. Moreover, the gate dielectric layer 114 may have a bandgap energy that is greater than a bandgap energy of the barrier layer 106 and the buffer layer 104. In other words, the gate dielectric layer 114 may provide a wider bandgap than the barrier layer 106.

As discussed above, the gate terminal 108 may receive a control signal (e.g., a gate voltage) to control switching of current flow between the source terminal 110 and the drain terminal 112. As discussed above, the IC device 200 may allow current to flow in a channel between the source terminal 110 and the drain terminal 112 when the control signal has a voltage above the threshold voltage of the IC device 200. In some embodiments, the threshold voltage may be about zero volts.

In various embodiments, the gate dielectric layer 114 with fluoride- or chloride-based compound, as discussed herein, may allow a higher voltage to be placed on the gate terminal 108 than for a conventional HEMT with a Schottky layer. For example, the IC device 100 may have an operating range, over which a change in voltage creates a corresponding change in current in the channel, from the threshold voltage of the IC device 100 up to a maximum voltage. In some embodiments, the maximum voltage may be about 1.5 volts or higher, such as about 1.5 volts to about 8 volts. This may allow for higher current flow between the source terminal 110 and drain terminal 112 for the IC device 100 compared with conventional E-mode HEMT devices.

The gate dielectric layer 114 may be composed of any of a variety of suitable fluoride- or chloride-based compounds, such as calcium fluoride ($CaF_2$), cadmium fluoride ($CdF_2$), and/or potassium chloride (KCl).

In some embodiments, the gate dielectric layer 114 may be epitaxially coupled with the barrier layer 106. The gate dielectric layer 114 may be disposed between the gate terminal 108 and the buffer layer 104, as shown. In some embodiments, the intervening barrier layer 106 may protect a channel interface between the buffer layer 104 and the barrier layer 106 and allow formation of the gate dielectric layer 114 without inducing trap or other defect formation. Conversely, conventional recess or deposition processes may expose the channel interface, thereby inducing defect formation, such as formation of traps.

According to various embodiments, the gate dielectric layer 114 may have a thickness of about 20 to about 500 Angstroms in a direction that is substantially perpendicular to a surface of the buffer layer 104 upon which the barrier layer 106 is formed. For example, in one embodiment, the thickness of the gate dielectric layer may be about 100 to about 200 Angstroms. Other thicknesses may be used for the gate dielectric layer 114 in other embodiments.

The gate terminal 108 may have a trunk (e.g., bottom) portion and a top portion that extends away from the trunk portion in an opposing direction that is substantially parallel to a surface of the substrate 102 upon which the stack 101 is fabricated, as shown in FIG. 1. Such configuration of the trunk portion and top portion of the gate terminal 108 may be referred to as a T-shaped field-plate gate. That is, in some embodiments, the gate terminal 108 may have an integrated field-plate (e.g., the top portion of the gate terminal 108), which may increase a breakdown voltage and/or reduce an electric field between the gate terminal 108 and the drain terminal 112. The integrated field-plate may facilitate higher voltage operation of the IC device 100. In other embodiments, the gate terminal 108 may not be a T-shape. For example, the gate terminal 108 may include a substantially rectangular cross-section.

Additionally, or alternatively, the IC device 100 may include a dielectric layer 118. The dielectric layer 118 may facilitate high-power operation of the IC device 100. The dielectric layer 118 may be disposed on the barrier layer 106 on both sides of the gate terminal 108. The top portion of the gate terminal 108 may extend over the dielectric layer 118 as shown. The dielectric layer 118 may be composed of any suitable material or materials, such as nitride or oxide. In some embodiments, the dielectric layer 118 may be composed of a plurality of layers and/or compounds.

In some embodiments, the gate dielectric layer 114 may be disposed between the gate terminal 108 and the dielectric layer 118. In other embodiments, the gate terminal 108 may be directly coupled to the dielectric layer 118. In some such embodiments, the gate dielectric layer 114 may be disposed substantially only between the bottom of the gate terminal 108 and the barrier layer 106 (e.g., as shown in FIG. 2, further discussed below). In other embodiments, the gate dielectric layer 114 may be disposed in a blanket layer on top of the barrier layer 106 (e.g., as shown in FIG. 3, further discussed below). In that case, the dielectric layer 118 (if included) may be disposed on top of the gate dielectric layer 114.

Other embodiments of IC device 100 may not include the dielectric layer 118. Some embodiments of the IC device 100 may include one or more additional layers that are not shown in FIG. 1. For example, some embodiments may include one or more passivation layers.

In various embodiments, the source terminal 110 and drain terminal 112 of the IC device 100 may be formed on the barrier layer 106. The source terminal 110 and the drain terminal 112 may be composed of an electrically conductive material such as metal. In an embodiment, the source terminal 110 and the drain terminal 112 may include titanium (Ti), aluminum (Al), molybdenum (Mo), gold (Au), and/or silicon (Si). Other materials may be used in other embodiments.

In various embodiments, the source terminal 110 and the drain terminal 112 may extend through the barrier layer 106 into the buffer layer 104. For example, the source terminal 110 and drain terminal 112 may be diffused through the barrier layer 106. Alternatively, the barrier layer may be etched, and a doped nitride material may be regrown in the etched portion. A conductive material (e.g., metal) may be deposited on the doped nitride material to form the source terminal 110 and/or drain terminal 112.

FIG. 2 illustrates a D-mode IC device 200 in accordance with various embodiments. D-mode IC device 200 uses a negative gate voltage with respect to source voltage in order to pinch-off current flow in the IC device 200. IC device 200 may be a transistor, such as a HEMT device.

IC device 200 may include similar layers to IC device 100. For example, as shown in FIG. 2, the IC device 200 may include a buffer layer 204 formed on a substrate 202, and a barrier layer 206 formed on the buffer layer 204. The IC device 200 may further include a gate terminal 208, a source terminal 210, and a drain terminal 212. A gate dielectric layer 214 may be disposed between the gate terminal 208 and the barrier layer 206. The gate dielectric layer 214 may include a fluoride- or chloride-based compound as discussed herein.

As shown, the D-mode IC device 200 may not include a recess in the barrier layer 206. Additionally, the gate dielectric layer 214 shown in FIG. 2 may be disposed only between the bottom of the gate terminal 208 and the barrier layer 206. In some embodiments, the gate terminal 208 may be directly coupled to the dielectric layer 218. Other embodiments may include more or less layers than those shown in FIG. 2. Additionally, or alternatively, other embodiments may include a different arrangement of layers than that shown in FIG. 2.

In various embodiments, the IC device 200 may be configured to receive a control signal at the gate terminal 208 to control current flow in a channel between the source terminal 210 and the drain terminal 212. The gate dielectric layer 214 may allow a higher voltage control signal to be used compared with prior D-mode IC devices. For example, the IC device 200 may have an operating range, over which a change in voltage creates a corresponding change in current in the channel, from the pinch-off voltage (also referred to as the threshold voltage) of the IC device up to a maximum voltage. In some embodiments, the maximum voltage may be about 8 volts or more. The pinch-off voltage may be about −4 volts in some embodiments. Thus, the gate dielectric layer 214 may provide a wider operating range for the IC device 200, thereby allowing more control over the channel.

FIG. 3 illustrates an alternative D-mode IC device 300 in accordance with various embodiments. IC device 300 includes similar layers to IC device 200, including a substrate 302, a buffer layer 304, and a barrier layer 306. However, IC device 300 includes a gate dielectric layer 314 that is deposited as a blanket layer on barrier layer 306. The gate terminal 308 and dielectric layer 318 (if included) may be disposed on top of the gate dielectric layer 314. Portions of the gate dielectric layer 318 may be removed (e.g., etched) for the source terminal 310 and drain terminal 312. In some embodiments, portions of the barrier layer 306 may also be removed under the locations for source terminal 310 and drain terminal 312. A doped nitride material may be regrown in the removed portions of the barrier layer 306, and the source terminal 310 and drain terminal 312 may be formed on the respective portions of regrown doped nitride material.

In various embodiments, the IC device 100, 200, and/or 300 may be used for Radio Frequency (RF), logic, and/or power conversion applications. For example, the IC device 100, 200, and/or 300 may provide an effective switch device for power-switch applications including power conditioning applications such as, for example, Alternating Current (AC)-Direct Current (DC) converters, DC-DC converters, DC-AC converters, and the like.

Figure 4:
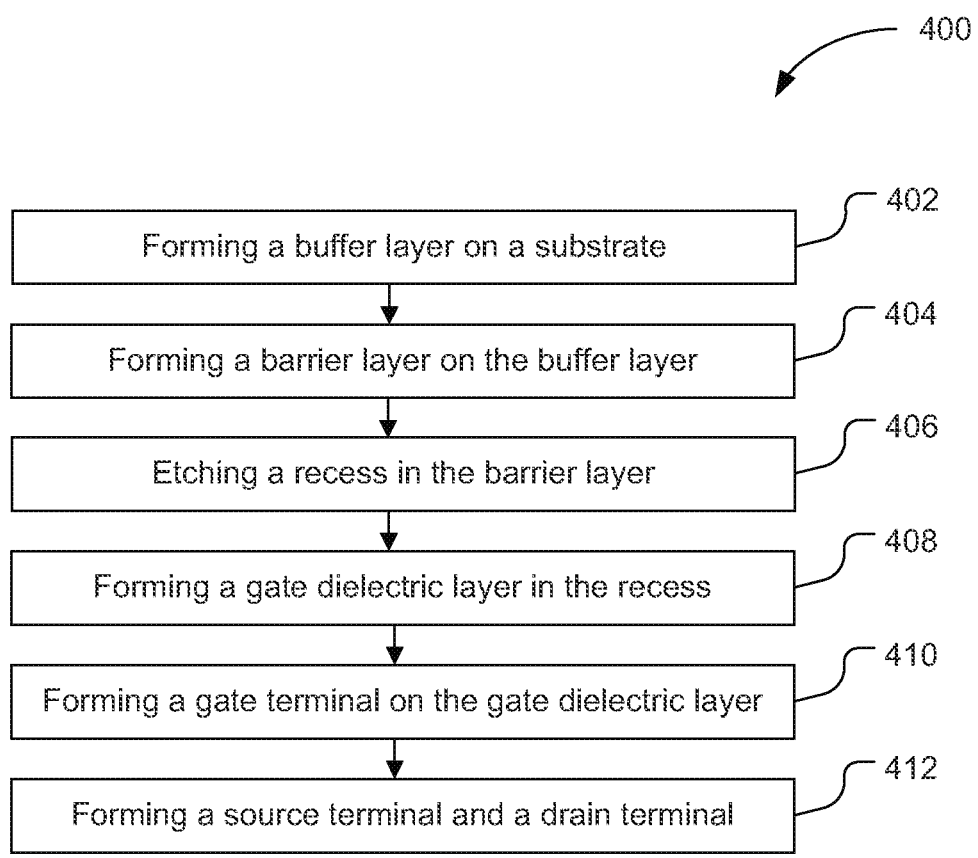
FIG. 4 is a flow diagram of a method for fabricating an IC device, according to various embodiments.

FIG. 4 is a flow diagram of a method 400 for fabricating an E-mode integrated circuit device (e.g., the IC device 100 of FIG. 1) according to various embodiments.

At 402, the method 400 includes forming a buffer layer (e.g., buffer layer 104) on a substrate (e.g., substrate 102). Forming the buffer layer may include epitaxially depositing a buffer layer material on the substrate. The buffer layer may be composed of multiple layers in some embodiments. In some embodiments, the buffer layer may include gallium nitride (GaN). In some embodiments, a nucleation layer may be formed on the substrate, and the buffer layer may be formed on top of the nucleation layer.

At 404, the method 400 may further include forming a barrier layer (e.g., barrier layer 106) on the buffer layer. Forming the barrier layer may include depositing a barrier layer material on the buffer layer (e.g., by chemical vapor deposition). The barrier layer may be composed of multiple layers in some embodiments. In other embodiments, the barrier layer may be formed by depositing a single layer of material.

At 406, the method 400 may further include etching a recess in the barrier layer (e.g., the recess 116). The etching may include removing a portion of the barrier layer to form the recess. The recess may or may not extend through the barrier layer to the buffer layer.

At 408, the method 400 may further include forming a gate dielectric layer (e.g., gate dielectric layer 114) in the recess. The gate dielectric layer may include a fluoride- or chloride-based compound, as discussed herein. Forming the gate dielectric layer may include depositing the fluoride- or chloride-based compound in the recess. The fluoride- or chloride-based compound may be epitaxially deposited or deposited in a polycrystalline layer. Suitable deposition methods include, but are not limited to, molecular beam epitaxy, atomic layer deposition, sputtering, evaporation, and physical vapor deposition. In some embodiments, depositing the gate dielectric layer includes depositing a thickness of the gate dielectric layer material that is about 20 to about 500 Angstroms.

At 410, the method 400 may further include forming a gate terminal (e.g., gate terminal 108) on the dielectric layer. The dielectric layer may be disposed between the gate terminal and the barrier layer and/or buffer layer. For example, the gate terminal may be separated from the barrier layer and/or buffer layer by the dielectric layer. The gate terminal may include a conductive material, such as a metal. In some embodiments, the gate terminal may be formed by evaporation.

At 412, the method 400 may further include forming a source terminal (e.g., source terminal 110) and a drain terminal (e.g., drain terminal 112) on the barrier layer. Forming the source terminal and drain terminal may include, for example, evaporating a metal on the barrier layer. In some embodiments, the source terminal and/or drain terminal may be diffused to the buffer layer. In other embodiments, the barrier layer may be etched, and a doped nitride material may be regrown in the etched portion of the barrier layer. The source terminal and/or drain terminal may be deposited on the regrown doped nitride material.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 5:
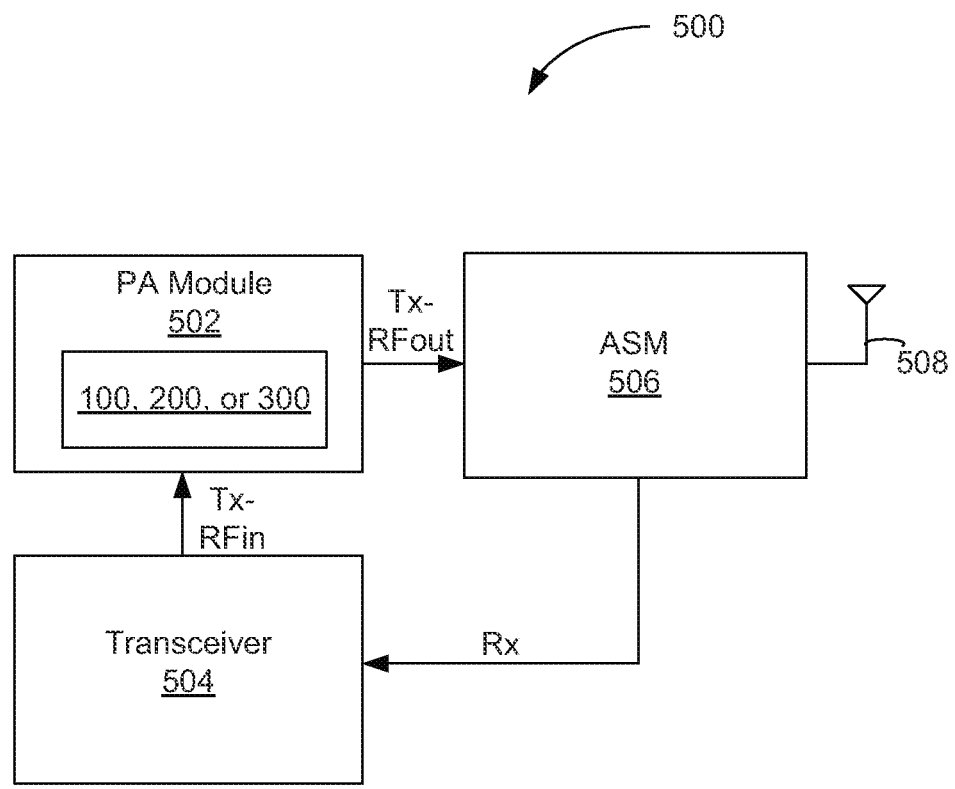
FIG. 5 schematically illustrates an example system including an IC device, according to various embodiments.

Embodiments of an IC device (e.g., the IC device 100, 200, and/or 300) described herein, and apparatuses including such IC device may be incorporated into various other apparatuses and systems. A block diagram of an example system 500 is illustrated in FIG. 5. As illustrated, the system 500 includes a power amplifier (PA) module 502, which may be a Radio Frequency (RF) PA module in some embodiments. The system 500 may include a transceiver 504 coupled with the power amplifier module 502 as illustrated. The power amplifier module 502 may include one or more IC devices (e.g., the IC device 100, 200, and/or 300) described herein.

The power amplifier module 502 may receive an RF input signal, RFin, from the transceiver 504. The power amplifier module 502 may amplify the RF input signal, RFin, to provide the RF output signal, RFout. The RF input signal, RFin, and the RF output signal, RFout, may both be part of a transmit chain, respectively noted by Tx—RFin and Tx—RFout in FIG. 5.

The amplified RF output signal, RFout, may be provided to an antenna switch module (ASM) 506, which effectuates an over-the-air (OTA) transmission of the RF output signal, RFout, via an antenna structure 508. The ASM 506 may also receive RF signals via the antenna structure 508 and couple the received RF signals, Rx, to the transceiver 504 along a receive chain.

In various embodiments, the antenna structure 508 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 500 may be any system including power amplification. The IC device (e.g., the IC device 100, 200, or 300) may provide an effective switch device for power-switch applications including power conditioning applications such as, for example, Alternating Current (AC)-Direct Current (DC) converters, DC-DC converters, DC-AC converters, and the like. In various embodiments, the system 500 may be particularly useful for power amplification at high radio frequency power and frequency. For example, the system 500 may be suitable for any one or more of terrestrial and satellite communications, radar systems, and possibly in various industrial and medical applications. More specifically, in various embodiments, the system 500 may be a selected one of a radar device, a satellite communication device, a mobile handset, a cellular telephone base station, a broadcast radio, or a television amplifier system.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An enhancement mode high electron mobility transistor (HEMT) device comprising:
    a buffer layer disposed on a substrate, the buffer layer including a first nitride-based material;
    a barrier layer disposed on the buffer layer, the barrier layer including a second nitride-based material and having a bandgap energy that is greater than a bandgap energy of the buffer layer;
    a recess in the barrier layer that does not extend into the buffer layer;
    a gate dielectric layer disposed in the recess, the gate dielectric layer formed of calcium fluoride ($CaF_2$), cadmium fluoride ($CdF_2$), or potassium chloride (KCl); and
    a gate terminal disposed on the gate dielectric layer, wherein the gate dielectric layer is disposed between the gate terminal and the barrier layer or between the gate terminal and the buffer layer.

2. The enhancement mode HEMT device of claim 1, wherein the buffer layer includes Gallium Nitride (GaN).

3. The enhancement mode HEMT device of claim 2, wherein the barrier layer includes Aluminum Gallium Nitride (AlGaN), indium aluminum nitride (InAlN), or indium gallium aluminum nitride (InGaAlN).

4. The enhancement mode HEMT device of claim 1, wherein the gate terminal is configured to control switching of the HEMT device.

5. The enhancement mode HEMT device of claim 1, wherein the recess does not extend to the buffer layer.

6. The enhancement mode HEMT device of claim 1, wherein a thickness of the gate dielectric layer is about 20 Angstroms to about 500 Angstroms.

7. The enhancement mode HEMT device of claim 1, further comprising a source terminal and a drain terminal disposed on the barrier layer on opposite sides of the gate terminal, wherein the gate dielectric layer is separated from the source terminal and the drain terminal.

8. The enhancement mode HEMT device of claim 7, further comprising:
a dielectric layer disposed on the barrier layer between the gate terminal and the source terminal and between the gate terminal and the drain terminal.

9. The enhancement mode HEMT device of claim 8, wherein the gate dielectric layer is disposed between the gate terminal and the dielectric layer.

10. The enhancement mode HEMT device of claim 7, wherein the gate terminal is configured to receive a control voltage to control switching of current in the barrier layer or buffer layer, and wherein the control voltage has an operating range up to 1.5 Volts or higher.

11. The enhancement mode HEMT device of claim 1, wherein the gate dielectric layer has a higher bandgap energy than the bandgap energy of the barrier layer.

* * * * *